US011223355B2

(12) United States Patent
Smith et al.

(10) Patent No.: US 11,223,355 B2
(45) Date of Patent: Jan. 11, 2022

(54) INDUCTIVELY-SHUNTED TRANSMON QUBIT FOR SUPERCONDUCTING CIRCUITS

(71) Applicant: Yale University, New Haven, CT (US)

(72) Inventors: W. Clarke Smith, New Haven, CT (US); Jayameenakshi Venkatraman, New Haven, CT (US); Xu Xiao, New Haven, CT (US); Lucas Verney, Montrouge (FR); Luigi Frunzio, North Haven, CT (US); Shyam Shankar, New Haven, CT (US); Mazyar Mirrahimi, New Haven, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 92 days.

(21) Appl. No.: 16/711,002

(22) Filed: Dec. 11, 2019

(65) Prior Publication Data

US 2020/0287540 A1 Sep. 10, 2020
US 2021/0258010 A9 Aug. 19, 2021

Related U.S. Application Data

(60) Provisional application No. 62/778,748, filed on Dec. 12, 2018.

(51) Int. Cl.
*H03K 17/92* (2006.01)
*H01L 27/18* (2006.01)

(52) U.S. Cl.
CPC ............. *H03K 17/92* (2013.01); *H01L 27/18* (2013.01)

(58) Field of Classification Search
CPC ................................ H03K 17/92; H01L 27/18
(Continued)

(56) References Cited

U.S. PATENT DOCUMENTS 4,344,052 A 8/1982 Davidson
4,403,189 A 9/1983 Simmonds
(Continued)

FOREIGN PATENT DOCUMENTS

CA 2849589 A1 10/2014
CN 101059556 A 10/2007
(Continued)

OTHER PUBLICATIONS

U.S. Appl. No. 16/537,990, filed Aug. 12, 2019, Schoelkopf III et al.
(Continued)

*Primary Examiner* — Tomi Skibinski
(74) *Attorney, Agent, or Firm* — Wolf, Greenfield & Sacks, P.C.

(57) ABSTRACT

Techniques for modifying the Josephson potential of a transmon qubit by shunting the transmon with an inductance are described. The inclusion of this inductance may increase the confined potential of the qubit system compared with the conventional transmon, which may lead to a transmon qubit that is stable at much higher drive energies. The inductive shunt may serve the purpose of blocking some or all phase-slips between the electrodes of the qubit. As a result, the inductively shunted transmon may offer an advantage over conventional devices when used for applications involving high energy drives, whilst offering few to no drawbacks in comparison to conventional devices when used at lower drive energies.

29 Claims, 11 Drawing Sheets

(58) Field of Classification Search
USPC .................................................. 327/528, 367
See application file for complete search history.

(56) References Cited

U.S. PATENT DOCUMENTS

| | | |
|---|---|---|
| 4,585,999 A | 4/1986 | Hilbert et al. |
| 4,780,724 A | 10/1988 | Sharma et al. |
| 4,956,312 A | 9/1990 | Van Laarhoven |
| 5,075,655 A | 12/1991 | Pond et al. |
| 5,105,166 A | 4/1992 | Tsukii et al. |
| 5,186,379 A | 2/1993 | Helber, Jr. |
| 5,254,950 A | 10/1993 | Fan et al. |
| 5,296,457 A | 3/1994 | Cooke et al. |
| 5,326,986 A | 7/1994 | Miller, Jr. et al. |
| 5,493,719 A | 2/1996 | Smith et al. |
| 5,635,834 A | 6/1997 | Sloggett et al. |
| 5,835,512 A | 11/1998 | Wada et al. |
| 6,549,059 B1 | 4/2003 | Johnson |
| 6,578,018 B1 | 6/2003 | Ulyanov |
| 6,621,374 B2 | 9/2003 | Higgins et al. |
| 6,627,915 B1 | 9/2003 | Ustinov et al. |
| 6,635,898 B2 | 10/2003 | Williams et al. |
| 6,822,255 B2 | 11/2004 | Tzalenchuk et al. |
| 6,838,694 B2 | 1/2005 | Esteve et al. |
| 6,900,454 B2 | 5/2005 | Blais et al. |
| 6,911,664 B2 | 6/2005 | Il'ichev et al. |
| 6,943,368 B2 | 9/2005 | Amin et al. |
| 7,015,499 B1 | 3/2006 | Zagoskin |
| 7,042,005 B2 | 5/2006 | Il'ichev et al. |
| 7,129,869 B2 | 10/2006 | Furuta et al. |
| 7,253,654 B2 | 8/2007 | Amin |
| 7,307,275 B2 | 12/2007 | Lidar et al. |
| 7,364,923 B2 | 4/2008 | Lidar et al. |
| 7,369,093 B2 | 5/2008 | Oppenländer et al. |
| 7,533,068 B2 | 5/2009 | Maassen van den Brink et al. |
| 7,724,083 B2 | 5/2010 | Herring et al. |
| 7,800,395 B2 | 9/2010 | Johnson et al. |
| 7,876,248 B2 | 1/2011 | Berkley et al. |
| 7,899,092 B2 | 3/2011 | Malinovsky |
| 7,932,515 B2 | 4/2011 | Bunyk |
| 8,032,474 B2 | 10/2011 | Macready et al. |
| 8,106,717 B2 | 1/2012 | Ichimura et al. |
| 8,111,083 B1 | 2/2012 | Pesetski et al. |
| 8,138,784 B2 | 3/2012 | Przybysz et al. |
| 8,416,109 B2 | 4/2013 | Kirichenko |
| 8,514,478 B1 | 8/2013 | Spence |
| 8,525,619 B1 | 9/2013 | Olsson et al. |
| 8,600,200 B1 | 12/2013 | Rakich et al. |
| 8,642,998 B2 | 2/2014 | Gambetta et al. |
| 8,841,764 B2 | 9/2014 | Poletto et al. |
| 9,350,460 B2 | 5/2016 | Paik |
| 9,379,303 B2 | 6/2016 | Gambetta et al. |
| 9,503,063 B1 | 11/2016 | Abraham et al. |
| 9,836,699 B1 | 12/2017 | Rigetti et al. |
| 9,892,365 B2 | 2/2018 | Rigetti et al. |
| 10,424,711 B2 | 9/2019 | Schoelkopf, III et al. |
| 10,424,712 B2 | 9/2019 | Schoelkopf et al. |
| 10,468,740 B2 | 11/2019 | Minev et al. |
| 2001/0025012 A1 | 9/2001 | Tarutani et al. |
| 2002/0188578 A1 | 12/2002 | Amin et al. |
| 2003/0027724 A1 | 2/2003 | Rose et al. |
| 2003/0136973 A1 | 7/2003 | Ogawa et al. |
| 2003/0193097 A1 | 10/2003 | Il'ichev et al. |
| 2003/0207766 A1* | 11/2003 | Esteve .................. G06N 10/00 505/190 |
| 2004/0059760 A1 | 3/2004 | Ageishi et al. |
| 2004/0140537 A1 | 7/2004 | Il'ichev et al. |
| 2005/0117836 A1 | 6/2005 | Franson et al. |
| 2005/0134377 A1 | 6/2005 | Dent |
| 2005/0224784 A1 | 10/2005 | Amin et al. |
| 2006/0179029 A1 | 8/2006 | Vala et al. |
| 2007/0215862 A1 | 9/2007 | Beausoleil et al. |
| 2007/0296953 A1 | 12/2007 | Allen et al. |
| 2008/0100175 A1 | 5/2008 | Clark |
| 2008/0274898 A1 | 11/2008 | Johnson et al. |
| 2009/0028340 A1 | 1/2009 | Trifonov |
| 2009/0033369 A1 | 2/2009 | Baumgardner et al. |
| 2009/0074355 A1 | 3/2009 | Beausoleil et al. |
| 2009/0153180 A1 | 6/2009 | Herring et al. |
| 2009/0232191 A1 | 9/2009 | Gupta et al. |
| 2009/0258787 A1 | 10/2009 | Wilkie et al. |
| 2009/0289638 A1 | 11/2009 | Farinelli et al. |
| 2010/0241780 A1 | 9/2010 | Friesen |
| 2010/0246152 A1 | 9/2010 | Lin et al. |
| 2011/0060710 A1 | 3/2011 | Amin |
| 2011/0079889 A1 | 4/2011 | Baillin |
| 2012/0074509 A1 | 3/2012 | Berg et al. |
| 2012/0319085 A1 | 12/2012 | Gambetta et al. |
| 2012/0319684 A1 | 12/2012 | Gambetta et al. |
| 2012/0326130 A1 | 12/2012 | Maekawa et al. |
| 2012/0326720 A1 | 12/2012 | Gambetta et al. |
| 2013/0043945 A1 | 2/2013 | McDermott et al. |
| 2013/0107352 A1 | 5/2013 | Santori et al. |
| 2013/0196855 A1 | 8/2013 | Poletto et al. |
| 2014/0112107 A1 | 4/2014 | Guo et al. |
| 2014/0228222 A1 | 8/2014 | Berkley et al. |
| 2014/0314419 A1 | 10/2014 | Paik |
| 2015/0357550 A1 | 12/2015 | Schoelkopf, III et al. |
| 2015/0372217 A1 | 12/2015 | Schoelkopf et al. |
| 2016/0148112 A1 | 5/2016 | Kwon |
| 2018/0069288 A1 | 3/2018 | Minev et al. |

FOREIGN PATENT DOCUMENTS

| | | |
|---|---|---|
| CN | 103582949 A | 2/2014 |
| EP | 0 513 856 A2 | 11/1992 |
| EP | 2 249 173 A1 | 11/2010 |
| EP | 2 264 799 A1 | 12/2010 |
| GB | 1 370 647 A | 10/1974 |
| JP | 61-082449 A | 4/1986 |
| JP | 02-194638 A | 8/1990 |
| JP | H09-069724 A | 3/1997 |
| JP | 2004-523907 A | 8/2004 |
| JP | 2006-527548 A | 11/2006 |
| JP | 2015-508253 A | 3/2015 |
| RU | 2 106 717 C1 | 3/1998 |
| RU | 2 212 671 C1 | 9/2003 |
| RU | 2010 124 198 A | 12/2011 |
| WO | 2012/173711 A1 | 12/2012 |
| WO | 2012/173712 A1 | 12/2012 |

OTHER PUBLICATIONS

U.S. Appl. No. 16/538,035, filed Aug. 12, 2019, Schoelkopf III et al.
PCT/US2014/012073, Nov. 13, 2014, International Search Report and Written Opinion.
PCT/US2014/012073, Jul. 30, 2015, International Preliminary Report on Patentability.
EP 14778477.1, Aug. 18, 2016, Extended European Search Report.
PCT/US2014/012080, Nov. 13, 2014, International Search Report and Written Opinion.
PCT/US2014/012080, Jul. 30, 2015, International Preliminary Report on Patentability.
EP 14783459.2, Aug. 12, 2016, Extended European Search Report.
PCT/US2016/019801, May 23, 2016, International Search Report and Written Opinion.
EP 16756456.6, Oct. 19, 2018, Extended European Search Report.
PCT/US2018/020190, May 30, 2018, International Search Report and Written Opinion.
PCT/US2018/020197, May 29, 2018, International Search Report and Written Opinion.
International Search Report and Written Opinion for International Application No. PCT/US2014/012073 dated Nov. 13, 2014.
International Preliminary Report on Patentability for International Application No. PCT/US2014/012073 dated Jul. 30, 2015.
Extended European Search Report for European Application No. EP 14778477.1 dated Aug. 18, 2016.
International Search Report and Written Opinion International Application No. PCT/US2014/012080 dated Nov. 13, 2014.

(56) References Cited

OTHER PUBLICATIONS

International Preliminary Report on Patentability for International Application No. PCT/US2014/012080 dated Jul. 30, 2015.
Extended European Search Report for European Application No. EP 14783459.2 dated Aug. 12, 2016.
International Search Report and Written Opinion for International Application No. PCT/US2016/019801 dated May 23, 2016.
Extended European Search Report for European Application No. EP 16756456.6 dated Oct. 19, 2018.
International Search Report and Written Opinion for International Application No. PCT/US2018/020190 dated May 30, 2018.
International Search Report and Written Opinion for International Application No. PCT/US2018/020197 dated May 29, 2018.
Abdo et al., Directional amplification with a Josephson circuit. Phys Rev X. 2013;3:031001.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson amplifier for qubit readout. Appl Phys Lett. 2011;99(16):162506. doi: 10.1063/1.3653473.
Abdo et al., Josephson directional amplifier for quantum measurement of superconducting circuits. Phys Rev Lett. Apr. 25, 2014;112:167701.1-5. doi: 10.1103/PhysRevLett.112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310.1523v2. 15 pages.
Bell et al., Quantum superinductor with tunable nonlinerity. Phys Rev Lett. 2012;109:137003. doi:10.1103/PhysRevLett.109.137003.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature. May 6, 2010;465(7294):64-8. doi: 10.1038/nature09035.
Brown et al., Microwave and millimeter-wave high-Q micromachined resonators. Int J RF and Microwave CAE. 1999;9:326-37.
Burgarth et al., Non-Abelian phases from quantum Zeno dynamics. Phys Rev A. Oct. 9, 2013;88:042107.1-5. doi: 10.1103/PhysRevA.88.042107.
Campagne-Ibarcq et al., Deterministic remote entanglement of superconducting circuits through microwave two-photon transitions. Phys Rev Lett. May 16, 2018;120:200501.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomies. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Catelani et al., Decoherence of superconducting qubits caused by quasiparticle tunneling. Phys Rev B. 2012;86:184514.
Catelani et al., Quasiparticle Relaxation of Superconducting Qubits in the Presence of Flux. Phys Rev Lett. 2011;106:077002.
Catelani et al., Relaxation and frequency shifts induced by quasiparticles in superconducting qubits. Phys Rev. 2011;B84:064517.
Chaturvedi et al., Berry's phase for coherent states. J Phys A: Math Gen. 1987;20(16):L1071-5.
Chow et al., Detecting highly entangled states with a joint qubit readout. Phys Rev A. 2010;81:062325.
Chow et al., Optimized driving of superconducting artificial atoms for improved single-qubit gates. Phys Rev. 2010;A82:040305.
Chow et al., Universal quantum gate set approaching fault-tolerant thresholds with superconducting qubits. Phys Rev Lett. 2012;109:060501.
Chu et al., Quantum acoustics with superconducting qubits. Science. 2017;358:199-202.
Chu et al., Suspending superconducting qubits by silicon micromachining. Appl Phys Lett. 2016;109:112601.
Clarke et al., Superconducting quantum bits. Nature. Jun. 19, 2008;453(7198):1031-42. doi: 10.1038/nature07128.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Ponte et al., Relaxation- and decoherence-free subspaces in networks of weakly and strongly coupled resonators. Ann Phys. Mar. 12, 2007;322:2077-84.
Devoret et al., Implementing qubits with superconducting integrated circuits. Experimental Aspects of Quantum Computing. 2005:163-203.
Devoret et al., Superconducting Circuits for Quantum Information: An Outlook. Science. Mar. 8, 2013;339:1169-74. doi: 10.1126/science.1231930.
Dicarlo et al., Demonstration of two-qubit algorithms with a superconducting quantum processor. Nature. Jul. 9, 2009;460(7252):240-4. doi: 10.1038/nature08121. Epub Jun. 28, 2009.
Dicarlo et al., Preparation and measurement of three-qubit entanglement in a superconducting circuit. Nature. Sep. 30, 2010;467(7315):574-8. doi: 10.1038/nature09416.
Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Elliott et al., Enhancement and state tomography of a squeezed vacuum with circuit quantum electrodynamics. Phys Rev A. 2015;92:013826.
Facchi et al., Quantum Zeno Subspaces. Phys Rev Lett. Aug. 19, 2002;89(8):080401.1-4.
Frattini et al., 3-wave mixing Josephson dipole element. Appl Phys Lett. 2017;110:222603.
Gao et al., Programmable interference between two microwave quantum memories. Phys Rev X. 2018;8:021073.
Geerlings et al., Improving the Quality Factor of Microwave Compact Resonators by Optimizing their Geometrical Parameters. App Phys Lett. 2012;100:192601.
Ginossar et al., Nonlinear oscillators and high fidelity qubit state measurement in circuit quantum electrodynamics. Fluctuating Nonlinear Oscillators. Nanomechanics to quantum superconducting circuits. Oxford University Press. 2012. Chapter 8:198-216.
Girvin et al., Circuit QED and engineering charge-based superconducting qubits. Physica Scripta. 2009;T137:014012.
Heeres et al., Cavity State Manipulation Using Photon-Number Selective Phase Gates. Phys Rev Lett. Sep. 25, 2015;115:137002. 1-5. doi: 10.1103/PhysRevLett.115.137002.
Hofheinz et al., Generation of Fock states in a superconducting quantum circuit. Nature. Jul. 17, 2008;454(7202):310-4. doi: 10.1038/nature07136.
Hofheinz et al., Synthesizing arbitrary quantum states in a superconducting resonator. Nature. May 28, 2009;459:546-9. doi:10.1038/nature08005. Supplementary Information. 5 pages.
Houck et al., Controlling the spontaneous emission of a superconducting transmon qubit. Phys Rev Lett. 2008;101:080502.
Houck et al., Life after charge noise: recent results with transmon qubits. Quantum Info Process. Feb. 11, 2009;8(2-3):105-15.
Hover et al., High fidelity qubit readout with the superconducting lowinductance undulatory galvanometer microwave amplifier. Appl Phys Lett. 2014;104:152601.1-4.
Hover et al., Superconducting Low-inductance Undulatory Galvanometer Microwave Amplifier. Appl Phys Lett. Feb. 7, 2012;100:063503.1-3.

(56) References Cited

OTHER PUBLICATIONS

Johnson et al., Dispersive readout of a flux qubit at the single-photon level. Phys Rev B. 2011;84:220503. arXiv:1109.2858v2. 5 pages.

Johnson et al., Quantum non-demolition detection of single microwave photons in a circuit. Nature. 2010;6:663-667.

Kamal et al., Gain, directionality, and noise in microwave SQUID amplifiers: Input-output approach. Phys Rev B. 2012;86:144510.1-12. doi: 10.1103/PhysRevB.86.144510.

Kamal et al., Noiseless nonreciprocity in a parametric active device. Nature Physics. 2011;7:311-15.

Kamal et al., Signal-to-pump back action and self-oscillation in double pump Josephson parametric amplifier. Phys Rev B. 2009;79:184301.

Kerckhoff et al., On-chip superconducting microwave circulator from synthetic rotation. Phys Rev Appl. 2015;4:034002. arXiv:1502.06041. Submitted Feb. 21, 2015. 13 pages.

Kerman, Metastable superconducting qubit. Phys Rev Lett. 2010;104:027002.

Kirchmair et al., Observation of quantum state collapse and revival due to the single-photon Kerr effect. Nature. Mar. 14, 2013;495(7440):205-9. doi: 10.1038/nature11902.

Kirchmair et al., Observation of quantum state collapse and revival due to the single-photon Kerr effect. Nature. Mar. 14, 2013;495:205-9. doi:10.1038/nature11902.

Knill et al., Theory of Quantum Error Correction for General Noise. Phys Rev Lett. Mar. 13, 2000;84(11):2525-8. arXiv:quant-ph/9908066v1. 6 pages.

Koch et al., Charge-insensitive qubit design derived from the Cooper pair box. Phys Rev A. 2007;76:042319.

Koch et al., Charging effects in the inductively shunted Josephson junction. Phys Rev Lett. 2009;103:217004.

Koch et al., Time-reversal symmetry breaking in circuit-QED based photon lattices. arXiv:1006.0762v2. Oct. 11, 2010. 19 pages.

Krastanov et al., Universal Control of an Oscillator with Dispersive Coupling to a Qubit. Phys Rev A. 2015;92:040303. arXiv:1502.08015. Submitted Feb. 27, 2015. 5 pages.

Kuhr et al., Ultrahigh finesse Fabry-Perot superconducting resonator. Appl Phys Lett. 2007;90:164101.

Lee et al. Chemically etched ultrahigh-Q wedge-resonator on a silicon chip. Nature Photonics. 2012;6:369-73.

Leghtas et al., Confining the state of light to a quantum manifold by engineered two-photon loss. Dec. 16, 2014. arXiv:1412.4633v1. 29 pages.

Leghtas et al., Deterministric protocol for mapping a qubit to coherent state superpositions in a cavity. Phys Rev A. 2013;87:042315.

Leghtas et al., Hardware-efficient autonomous quantum memory protection. Phys Rev Lett. 2013;111:120501.

Leghtas et al., Quantum engineering. Confining the state of light to a quantum manifold by engineered two-photon loss. Science. Feb. 20, 2015;347(6224):853-7. doi: 10.1126/science.aaa2085.

Lidar et al., Decoherence-Free Subspaces for Quantum Computation. Phys Rev Lett. Sep. 21, 1998;81(12):2594-7. arXiv:quant-ph/9807004v2. 4 pages.

Lindblad, On the generators of quantum dynamical semigroups. Commun Math Phys. 1976;48(2):119-30.

Lucero et al., Computing prime factors with a Josephson phase qubit quantum processor. Nature Phys. 2012;8:719-723.

Majer et al., Coupling superconducting qubits via a cavity bus. Nature. Sep. 2007;449(7161):443-7.

Manucharyan et al., Fluxonium: single Cooper-pair circuit free of charge offsets. Science. 2009;326:113-6.

Martinis et al., Decoherence in Josephson qubits from dielectric loss. Phys. Rev. Lett. Nov. 16, 2005;95(21):210503.

Masluk et al., Microwave characterization of Josephson junction arrays: Implementing a low loss superinductance. Phys Rev Lett. 2012;109:137002.

Minev et al., Planar Superconducting Whispering Gallery Mode Resonators. Appl Phys Lett. Oct. 3, 2013;103:142604.1-3. doi: 10.1063/1.4824201.

Mirrahimi et al., Dynamically protected cat-qubits: a new paradigm for universal quantum computation. New J Phys. Apr. 22, 2014;16:045014. 31 pages.

Mousolou et al., Universal non-adiabatic holonomic gates in quantum dots and single-molecule magnets. New J Phys. Jan. 17, 2014;16:013029. 10 pages.

Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.

Murch et al., Quantum state sensitivity of an autoresonant superconducting circuit. Phys Rev B. 2012;86:220503.

Narla et al., Robust concurrent remote entanglement between two superconducting qubits. Phys Rev X. 2016;6:031036.

Narla et al., Wireless Josephson amplifier. Appl Phys Lett. 2014;104:232605. doi: 10.1063/1.4883373. 6 pages.

Nigg et al., Black-box superconducting circuit quantization. Phys Rev Lett. 2012;108:240502.

Nigg et al., Stabilizer quantum error correction toolbox for superconducting qubits. Phys Rev Lett. 2013;110:243604.

O'Brien et al., Resonant Phase Matching of Josephson Junction Traveling Wave Parametric Amplifiers. Phys Rev Lett. Oct. 10, 2014;113:157001.1-5.

Ofek et al., Extending the lifetime of a quantum bit with error correction in superconducting circuits. Nature. 2016;536:441-445.

Oreshkov et al., Adiabatic Markovian Dynamics. Phys Rev Lett. Jul. 30, 2010;105(5):050503. arXiv:1002.2219v4. 7 pages.

Oreshkov et al., Fault-Tolerant Holonomic Quantum Computation. Phys Rev Lett. Feb. 20, 2009;102:070502.1-4.

Oreshkov, Holonomic Quantum Computation in Subsystems. Phys Rev Lett. Aug. 28, 2009;103(9):090502. arXiv:0905.1249v3. 5 pages.

Pachos et al., Decoherence-free dynamical and geometrical entangling phase gates. Phys Rev A. 2004;69:033817. arXiv:quant-ph/0309180v3. 10 pages.

Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.

Paz-Silva et al., Zeno Effect for Quantum Computation and Control. Phys Rev Lett. Feb. 24, 2012;108(8):080501. arXiv:1104.5507v2. 7 pages.

Pfaff et al., Controlled release of multiphoton quantum states from a microwave cavity memory. Nature Phys. 2017;13(9):882-887.

Pillet et al., Optimal design for the Josephson mixer. Mar. 30, 2015. arXiv:1503.08185v1. 5 pages.

Platenberg, Coupled superconducting flux qubits. Delft University of Technology. Thesis. 2007. 153 pages.

Ranzani et al., Graph-based analysis of nonreciprocity in coupled-mode systems. New J Phys. Oct. 15, 2014;17:023024. arXiv 2014;1406.4922v2. 21 pages.

Reagor et al., Quantum Memory with Millisecond Coherence in Circuit QED. Phys Rev B. 2016;94:014506.

Reagor et al., Reaching 10 ms single photon lifetimes for superconducting aluminum cavities. Appl Phys Lett. 2013;102:192604.

Reed et al., Fast reset and suppressing spontaneous emission of a superconducting qubit. App. Phys. Lett. 2010;96:203110.

Reed et al., High-Fidelity readout in circuit quantum electrodynamics using the Jaynes-Cummings nonlinearity. Phys Rev Lett. 2010;105:173601.

Reed et al., Realization of three-qubit quantum error correction with superconducting circuits. Nature. 2012;482:382.

Rigetti et al., Superconducting qubit in waveguide cavity with coherence time approaching 0.1ms. Phys Rev B. 2012;86,100506.

Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.

Ristè et al., Millisecond charge-parity fluctuations and induced decoherence in a superconducting transmon qubit. Nat Commun. 2013;4:1913. doi: 10.1038/ncomms2936.

Roch et al., Observation of measurement-induced entanglement and quantum trajectories of remote superconducting qubits. Phys Rev Lett. May 2, 2014;112:170501.1-5.

(56) References Cited

OTHER PUBLICATIONS

Roch et al., Widely Tunable, Nondegenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Rosenblum et al., Fault-tolerant detection of a quantum error. Science. Jul. 20, 2018;361(6399):266-70.
Sank et al., Measurement-induced state transitions in a superconducting qubit: beyond the rotating wave approximation. Phys Rev Lett. 2016;117:190503.
Sarandy et al., Abelian and non-Abelian geometric phases in adiabatic open quantum systems. Phys Rev A. Jun. 2006;73(6):062101. arXiv:quant-ph/0507012v3. 10 pages.
Sayrin et al., Real-time quantum feedback prepares and stabilizes photon number states. Nature. Aug. 31, 2011;477(7362):73-7. doi:10.1038/nature10376.
Schackert et al., Phase-preserving amplification near the quantum limit with a Josephson ring modulator. Nature. May 2010;465(7294):64-8. arXiv:0912.3407v1. 20 pages.
Schindler et al., Quantum simulation of dynamical maps with trapped ions. Nature Phys. May 19, 2013;9:361-7. arXiv:1212.2418v1. 28 pages.
Schoelkopf et al., Wiring up quantum systems. Nature. Feb. 7, 2008;451(7179):664-9. doi: 10.1038/451664a.
Schuster et al., Cavity QED in a molecular ion trap. Phys Rev A. 2011;83:012311.
Schuster et al., Resolving photon number states in a superconducting circuit. Nature. Feb. 1, 2007;445(7127):515-8.
Sears et al., Photon shot noise dephasing in the strong-dispersive limit of circuit QED. Phys Rev B. 2012;86:180504.
Siddiqi et al., An RF-Driven Josephson Bifurcation Amplifier for Quantum Measurement. Phys Rev Lett. Nov. 10, 2004;93:207002. arXiv:cond-mat/0312623v1. 4 pages.
Sjöqvist, Trends: A new phase in quantum computation. Phys. 2008;1:35. doi: 10.1103/Physics.1.35. 6 pages.
Spietz et al., Input Impedance and Gain of a Gigahertz Amplifier Using a dc Superconducting Quantum Interference Device in a Quarter Wave Resonator. Appl Phys Lett. 2008;93:082506. arXiv:0806.2853v1. 4 pages.
Steffen et al., High-coherence hybrid superconducting qubit. Phys Rev Lett. 2010;105:100502.
Sun et al., Measurements of quasiparticle tunneling dynamics in a band-gap-engineered transmon qubit. Phys Rev Lett. 2012;108:230509.
Verney et al., Structural instability of driven Josephson circuits prevented by an inductive shunt. Phys Rev Appl. Feb. 1, 2019;11:024003.
Vijay et al., Observation of Quantum Jumps in a Superconducting Artificial Atom. Phys Rev Lett. Mar. 18, 2011;106(11):110502.1-4.
Vijay et al., Quantum feedback control of a superconducting qubit: Persistent: Rabi oscillations. Nature. 2012;490:77-80.
Vijay et al., Stabilizing Rabi oscillations in a superconducting qubit using quantum feedback. Nature. Oct. 4, 2012;490(7418):77-80. doi: 10.1038/nature11505.
Vion et al., Manipulating the quantum state of an electrical circuit. Science. May 3, 2002;296(5569):886-9.
Wallraff et al., Approaching unit visibility for control of a superconducting qubit with dispersive readout. Phys Rev Lett. 2005;95:060501-060504.
Wallraff et al., Strong coupling of a single photon to a superconducting qubit using circuit quantum electrodynamics. Nature. Sep. 9, 2004;431(7005):162-7.
Wang et al., A Schrödinger cat living in two boxes. Science. May 27, 2016;352(6289):1087-91. doi: 10.1126/science.aaf2941.
Wang et al., Surface participation and dielectric loss in superconducting qubits. Appl Phys Lett. 2015;107:162601.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond-mat/0508729v1. Aug. 30, 2005. 60 pages.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
You et al., Superconducting qubits and quantum information. Physics Today. 2005;58(11):42.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in cavity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhu et al., Geometric quantum gates robust against stochastic control errors. Phys Rev A. Aug. 15, 2005;72(2):020301. arXiv:quant-ph/0407177v1. 4 pages.
Zmuidzinas, Superconducting microresonators: physics and applications. Annu Rev Condens Matter Phys. 2012;3:169-214.

* cited by examiner

INDUCTIVELY-SHUNTED TRANSMON QUBIT FOR SUPERCONDUCTING CIRCUITS

CROSS-REFERENCE TO RELATED APPLICATIONS

The present application claims the benefit under 35 U.S.C. § 119(e) of U.S. Provisional Patent Application No. 62/778,748, filed Dec. 12, 2018, titled "Inductively-Shunted Transmon for Superconducting Circuits," which is hereby incorporated by reference in its entirety.

GOVERNMENT FUNDING

This invention was made with government support under W911NF-14-1-0011 awarded by the United States Army Research Office. The government has certain rights in the invention.

BACKGROUND

The ability to prepare and control the quantum state of a quantum system is important for quantum information processing. Just as a classical computer memory should have the ability to initialize bits and implement gates to change the state of a bit from 0 to 1 and vice versa, a quantum computer should be able to initialize quantum states to store quantum information and to implement logical gates that change one or more of the quantum states.

Quantum information may be stored in any of a variety of quantum mechanical systems. Conventionally, quantum information may be stored using quantum bits, referred to as "qubits," which are typically quantum mechanical systems exhibiting two or more states. The state of a qubit can be used to encode quantum information. For example, a qubit may be realized as a quantum system that has a ground state and an excited state, and these two states may be used to denote quantum bit values of 0 and 1. Since the quantum system could be in a superposition of the two states, the qubit can also represent any quantum superposition of the 0 and 1 states.

SUMMARY

According to some aspects, a circuit quantum electrodynamics system is provided comprising a charge qubit, the charge qubit comprising a Josephson junction coupled to at least one capacitor, and a series array of Josephson junctions coupled to the charge qubit such that the series array is coupled in parallel to the Josephson junction of the charge qubit and in parallel to the at least one capacitor of the charge qubit.

According to some aspects, a circuit quantum electrodynamics system is provided comprising a charge qubit, the charge qubit comprising a Josephson junction coupled to at least one capacitor, and a superinductor coupled in parallel to the Josephson junction of the charge qubit and in parallel to the at least one capacitor of the charge qubit.

According to some aspects, a method of operating a circuit quantum electrodynamics (cQED) system is provided, the cQED system comprising an inductively shunted transmon qubit coupled to a transmission line, the method comprising applying a pump of frequency $\omega_p$ to the inductively shunted transmon qubit via the transmission line, and adjusting $\omega_p$, thereby causing a coupling strength between a Floquet mode of the inductively shunted transmon qubit $|\Phi_n\rangle$ and a Floquet mode of the inductively shunted transmon qubit $|\Phi_m\rangle$ to fall below a selected threshold, wherein n is 0 or 1, and wherein m is between 1 and 20.

According to some aspects, a circuit quantum electrodynamics system is provided comprising a charge qubit, the charge qubit comprising a Josephson junction coupled to at least one capacitor, and an inductor coupled in parallel to the Josephson junction of the charge qubit and in parallel to the at least one capacitor of the charge qubit, wherein the inductor has an inductive energy $E_L$, the Josephson junction has a Josephson energy $E_J$, and wherein $E_L/E_J$ is at least 3 and no greater than 6.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

As discussed above, quantum information may be stored using quantum bits, referred to as "qubits," which are typically quantum mechanical systems exhibiting two or more states. Some qubits utilize quantum states that relate to the presence or absence of electrical charge. For instance, a charge qubit may be formed from an island of superconducting material connected via a Josephson junction to a superconducting reservoir. Since the island is superconducting, conduction electrons therein form Cooper pairs and condense to a single ground state. Cooper pairs can tunnel across the Josephson junction but in a manner that exhibits a number of discrete electrostatic energy states within the island. Placing the system into one of these energy states can represent quantum information, and frequently the two lowest energy states are operated as a qubit. When desired, the charge states can be manipulated by applying suitable pulses to the superconducting island.

One type of charge qubit is the so-called transmon. In terms of the above-described charge qubit, in a transmon the island of superconducting material is coupled to one side of a capacitor in addition to the aforementioned Josephson junction. The transmon is designed to reduce charge noise by increasing the ratio of the Josephson energy of the junction to the charging energy of the capacitor. Increase of this ratio results in reduced sensitivity to charge noise and to the energy levels of the system becoming essentially independent of the amount of electrical charge across the junction. The transmon is described further, for instance, in "Charge-insensitive qubit design derived from the Cooper pair box," J. Koch et al., Phys. Rev. A 76, 042319 (2007), which is hereby incorporated by reference in its entirety.

The inventors have recognized and appreciated that a number of quantum information processing techniques involve the application of strong drive energies, and have observed experimentally that the coupling of a transmon to other systems does not scale with the drive energy beyond some critical energy. It has been observed that, beyond these drive energies, desirable properties of the transmon, such as its coherence properties, begin to deteriorate. The inventors have proposed that these observations may be a result of the transmon state escaping from a potential confinement imposed by the Josephson junction, resulting in free-particle like states, and/or a result of non-linear resonance(s) of the non-linear system. Irrespective of the underlying cause(s), this property of the transmon limits how it may be used in circuit quantum electrodynamics (cQED) systems by limiting the magnitude of the drives that may be applied to the transmon.

Figure 1B:
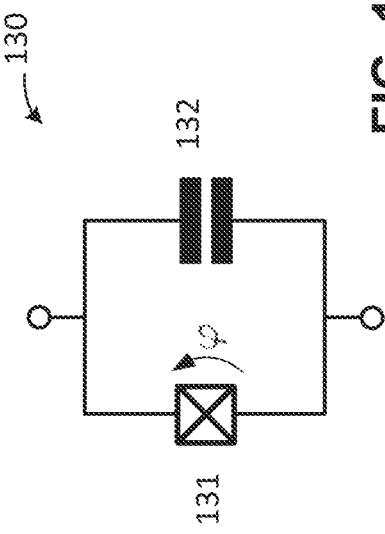
FIG. 1B illustrates a conventional transmon qubit, according to some embodiments.
Figure 1A:
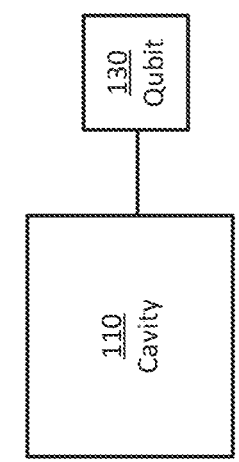
FIG. 1A depicts a photon cavity coupled to a transmon qubit, according to some embodiments.
Figure 1C:
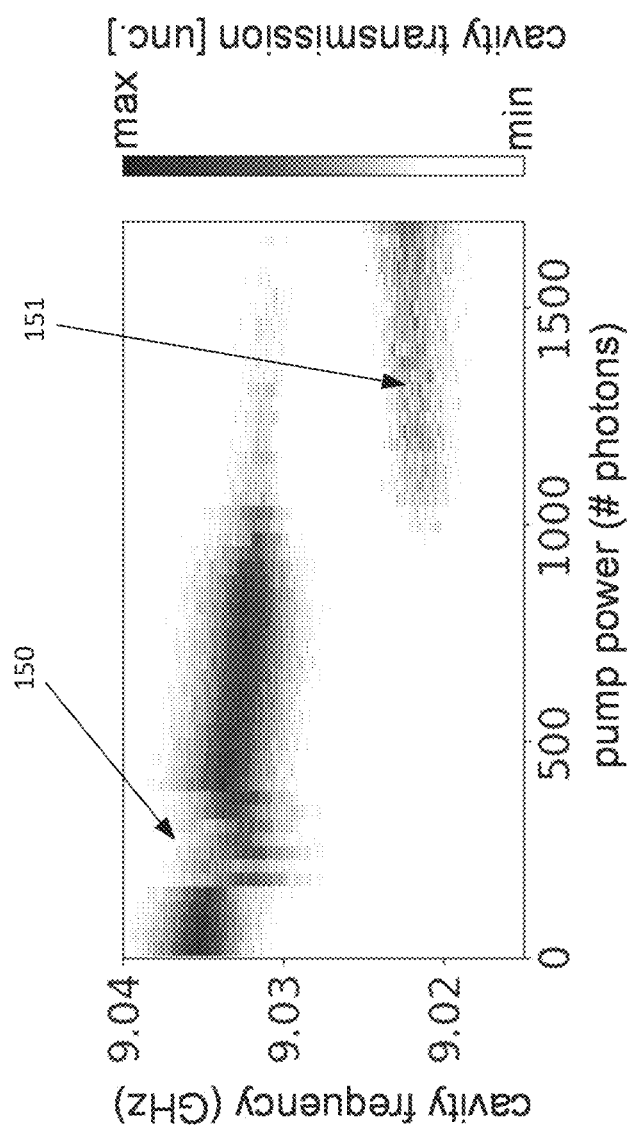
FIG. 1C illustrates experimental data obtained from a cavity coupled to a transmon qubit as in FIG. 1A, according to some embodiments.

This challenge is illustrated via FIGS. 1A-1C. FIG. 1A depicts a photon cavity 110 coupled to a transmon qubit 130, which is illustrated further in FIG. 1B. The transmon qubit 130 includes a Josephson junction 131 with a phase φ across the junction, and a capacitance 132 coupled in parallel with the junction 131. In general in the system of FIG. 1A there may also be a transmission line present via which energy may be pumped into the qubit and cavity system, although this is not depicted in the figure.

FIG. 1C illustrates experimental data obtained from a cavity coupled to a transmon qubit as in FIG. 1A, wherein the magnitude of energy transmission from the cavity is shown as a shade of grey (darker being greater transmission), as a function of the frequency of the cavity (vertical axis) and the power of the pump applied to the cavity-qubit system measured by a number of photons (horizontal axis). As may be noted, for weaker drives wherein the pump power is less than about 100 photons, the cavity transmission is stable and follows the linear variation of frequency with pump power expected from the AC Stark shift. However, at higher pump powers in region 150, the cavity frequency becomes unstable. A second region of instability 151 occurs at even higher pump powers.

Without wishing to be bound by theory, with respect to instability 150, it is believed the coupling between states of the non-linear transmon system at higher pump powers cause the cavity frequency to be unstable. This instability may be seen in FIG. 1C in region 150. With respect to instability 151, it is believed that the physics of the first few eigenstates of the transmon is dominated by the localization of the superconducting phase across the junction, or equivalently the suppression of phase-slips, which renders the energy level structure approximately harmonic. These desirable features may break down at eigenenergies comparable to the Josephson energy $E_J$ of the Josephson junction, owing to the boundedness of the potential. This breakdown may be seen in FIG. 1C in region 151, where the pump power has grown beyond the confining potential of the transmon.

Figure 2:
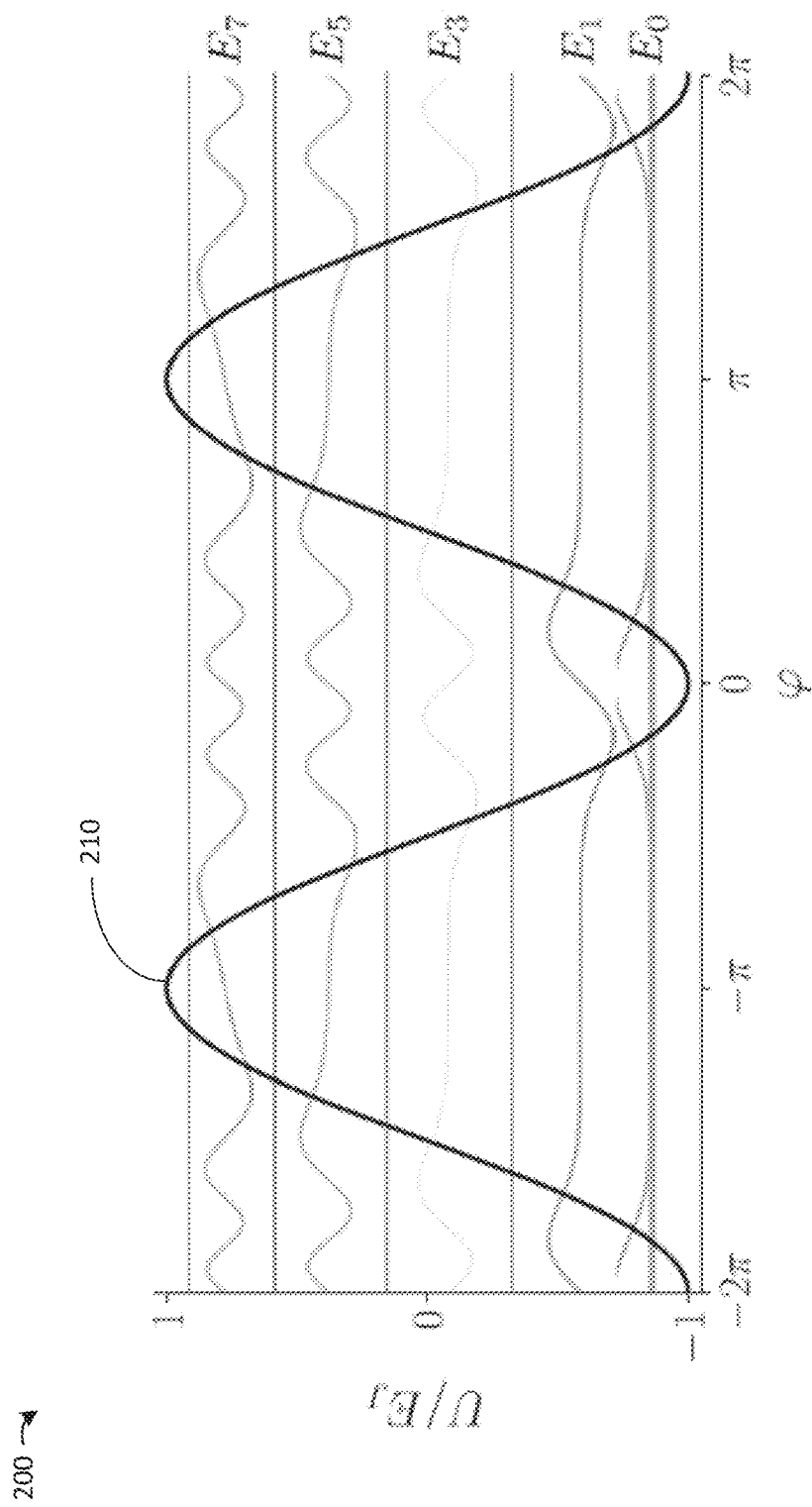
FIG. 2 illustrates the potential of a conventional transmon qubit, according to some embodiments.

The transmon potential is illustrated in FIG. 2, according to some embodiments. Line 210 in diagram 200 depicts the transmon potential U normalized by the Josephson energy of the transmon $E_J$, against the phase difference across the transmon φ. Note that the transmon potential U is periodic with the phase difference φ. Also shown in diagram 200 are the wavefunctions of several energy eigenstates of the transmon qubit, including the ground state $E_0$, the first excited state $E_1$, etc. As may be noted from FIG. 2, the transmon potential is unconfining at eigenenergies above the Josephson energy $E_J$. In addition, the energy eigenstates of the transmon are not completely localized within the potential wells of the transmon potential as can be seen by the variation of some of the eigenfunction wavefunctions within the potential's peaks. These features of the transmon can lead to the aforementioned instabilities at sufficiently high drive energies.

The inventors have recognized and appreciated techniques for modifying the Josephson potential of a transmon by shunting the transmon with an inductance. The inclusion of this inductance has been observed to increase the confined potential of the system compared with the conventional transmon, which may lead to a transmon that is stable at much higher drive energies. The inductive shunt may serve the purpose of blocking some or all phase-slips between the electrodes of the qubit. As a result, the inductively shunted transmon may offer an advantage over conventional devices when used for applications involving high energy drives, whilst offering few to no drawbacks in comparison to conventional devices when used at lower drive energies.

Figure 3:
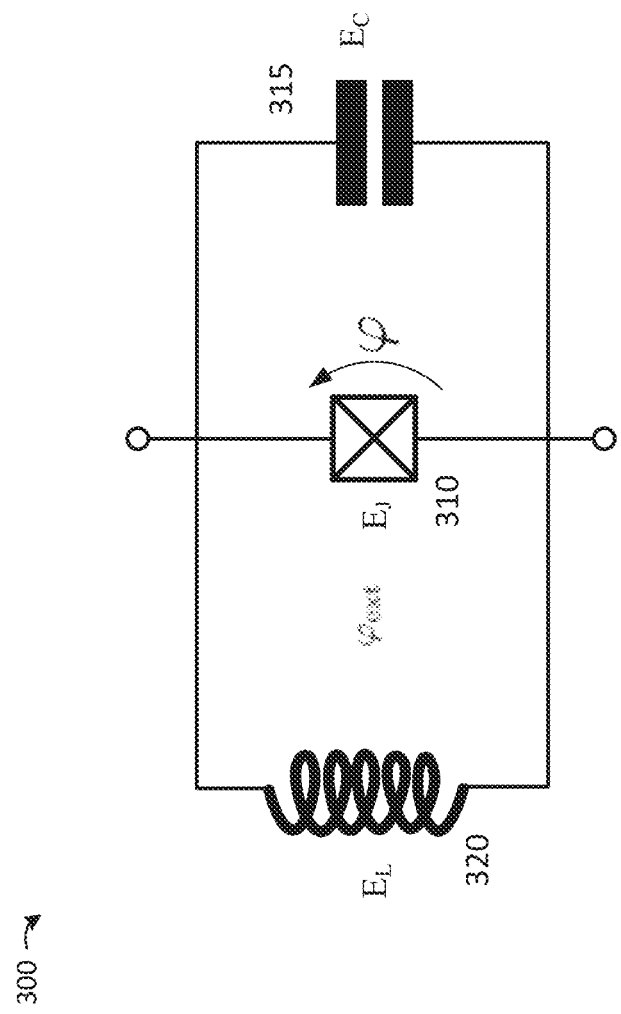
FIG. 3 depicts an illustrative inductively shunted transmon, according to some embodiments.

An illustrative inductively shunted transmon is depicted in FIG. 3, according to some embodiments. In the example of FIG. 3, inductively shunted transmon 300 includes a Josephson junction 310, a capacitance 315, and an inductance 320. As shown, each of the Josephson junction 310, capacitance 315, and inductance 320 are coupled in parallel with one another. In the example of FIG. 3, the Josephson junction has a Josephson energy $E_J$, the capacitance 315 has a charging energy $E_C$, and the inductance 320 has an inductive energy $E_L$. In addition, there is an inductive loop formed by the loop containing the inductance 320 and the Josephson junction 310; in the example of FIG. 3, there is a dc magnetic flux through this loop $\varphi_{ext}$.

According to some embodiments, the Josephson energy $E_J$ may be approximately equal to the inductive energy $E_L$. In some embodiments, the ratio of the inductive energy to the Josephson energy, $E_L/E_J$, is greater than or equal to 0.5, 0.75, 0.85, 0.9, 0.95, 1.0, 1.5, 2.0, 3.0, 4.0, 5.0, or 6.0. In some embodiments, the ratio of the inductive energy to the Josephson energy, $E_L/E_J$, is less than or equal to 10.0, 8.0, 6.0, 5.0, 4.0, 3.0, 2.5, 2.0, 1.5, 1.2, 1.1, or 1.0. Any suitable combinations of the above-referenced ranges are also possible (e.g., a ratio $E_L/E_J$ of greater than or equal to 0.75 and less than or equal to 1.5).

According to some embodiments, the Josephson energy $E_J$ may be much larger than the charging energy $E_C$. In some embodiments, the ratio of the Josephson energy to the charging energy, $E_J/E_C$, is greater than or equal to 5, 10, 25, 50, 75, 100, 150, or 200. In some embodiments, the ratio of the Josephson energy to the charging energy, $E_J/E_C$, is less than or equal to 500, 300, 200, 100, 75, 50, 25, or 10. Any suitable combinations of the above-referenced ranges are also possible (e.g., a ratio $E_J/E_C$ of greater than or equal to 25 and less than or equal to 100).

As discussed above, one of the advantageous of the transmon over other charge qubits is a reduced sensitivity to charge noise and to the energy levels of the system becoming essentially independent of the amount of electrical charge across the junction. These advantages scale with the ratio $E_J/E_C$; as such, a larger value of $E_J/E_C$ may be desirable (although the anharmonicity α of the transmon also decreases with $E_J/E_C$ so these effects are generally balanced by not making the charging energy too large).

In some embodiments, the dc magnetic flux $\varphi_{ext}$ is less than or equal to $10^{-12}$ weber, $10^{-13}$ weber, $10^{-14}$ weber, $10^{-15}$ weber, $10^{-16}$ weber, $10^{-17}$ weber, $10^{-18}$ weber, or $10^{-19}$ weber. In some embodiments, a magnetic flux density of the dc magnetic flux $\varphi_{ext}$ through the inductive loop formed by the loop containing the inductance 320 and the Josephson junction 310 is less than or equal to $10^{-3}$ tesla, $10^{-4}$ tesla, $10^{-5}$ tesla, $10^{-6}$ tesla, $10^{-7}$ tesla, $10^{-8}$ tesla, $10^{-9}$ tesla, or $10^{-10}$ tesla. Notwithstanding the above, the dc magnetic flux $\varphi_{ext}$ may preferably be zero.

According to some embodiments, the inductance 320 may be implemented using one or more linear inductors, and may include geometrical inductors in addition to highly inductive materials sometimes referred to as "superinductors." In some embodiments, the inductance 320 may comprise one or more Josephson junctions. Further examples of particular implementations of an inductively shunted transmon are discussed further below.

Figure 4:
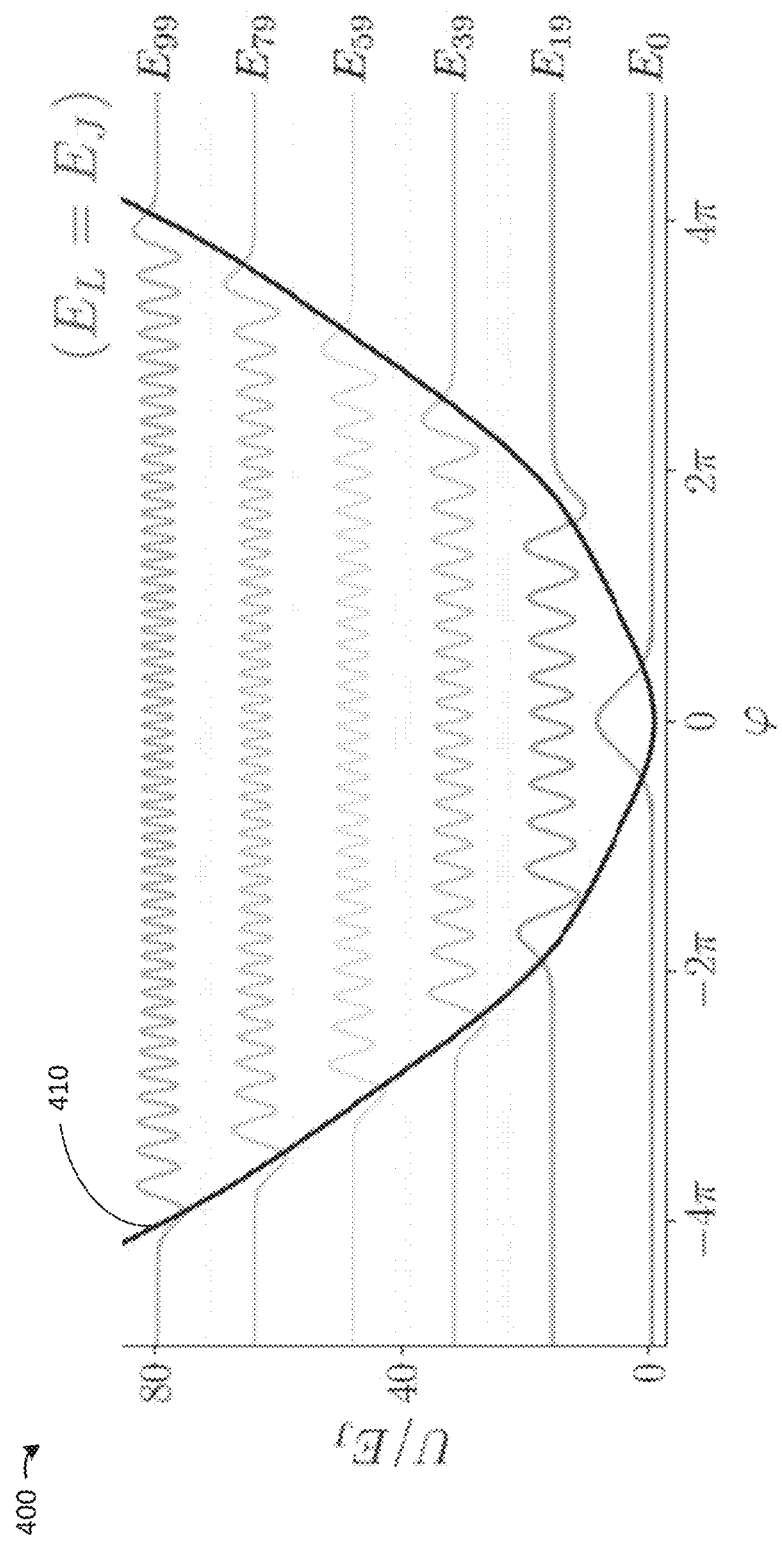
FIG. 4 illustrates the potential of the inductively shunted transmon of FIG. 3, according to some embodiments.

FIG. 4 illustrates the potential of the inductively shunted transmon 300, according to some embodiments. Line 410 in diagram 400 depicts the inductively shunted transmon potential U normalized by the Josephson energy of the Josephson junction $E_J$, against the phase difference across the inductively shunted transmon φ (note that φ in FIG. 4 is a different quantity from the φ used in FIG. 2 in that the phase in FIG. 4 is non-periodic). Also shown in diagram 400 are the wavefunctions of several energy eigenstates of the inductively shunted transmon qubit, including the ground state $E_0$, the nineteenth first excited state $E_{19}$, etc. In the illustrated example, the Josephson energy $E_J$ is equal to the inductive energy $E_L$.

In comparison with FIG. 2, which illustrates the conventional transmon, it may be noted that the potential of the inductively shunted transmon is confining at much higher energies than the conventional transmon. As shown in FIG. 2, the potential is unconfined at energies above the Josephson energy $E_J$, whereas as shown in FIG. 4, the potential is confining up to, and exceeding, 80 times the Josephson energy $E_J$. As a result, much higher energy eigenstates of the inductively shunted transmon are confined by the potential (e.g., the eigenstate $E_{99}$, whereas in FIG. 2 even $E_9$ has an energy that exceeds the potential well of the conventional transmon). Moreover, the wavefunctions of the inductively shunted transmon shown in FIG. 4 are much more localized in phase than those of the conventional transmon. This feature may better isolate the instabilities at weaker pump energies discussed above in relation to FIGS. 1A-1C.

Figure 5A:
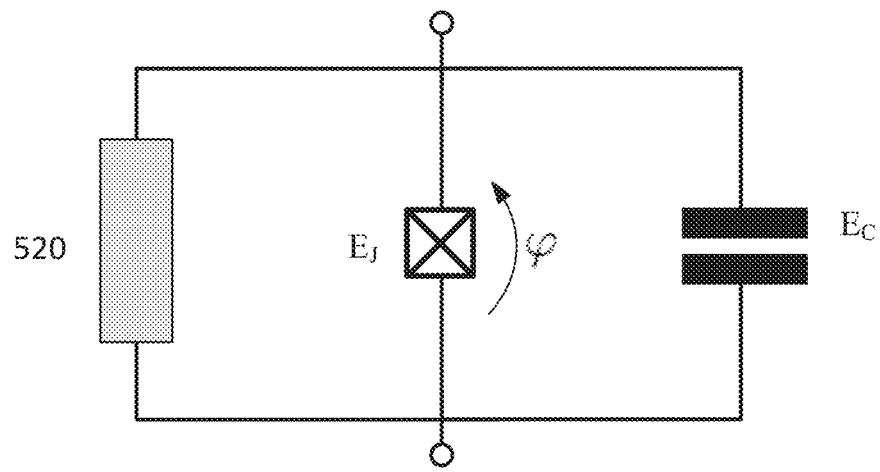
FIGS. 5A-5B depict illustrative implementations of the inductively shunted transmon of FIG. 4, according to some embodiments.
Figure 5B:
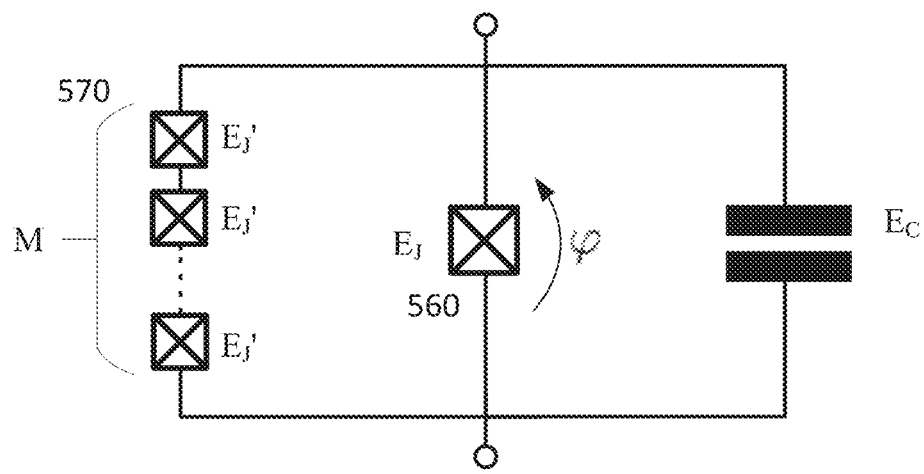

FIGS. 5A-5B depict illustrative implementations of the inductively shunted transmon of FIG. 4, according to some embodiments. In the example of FIG. 5A, inductively shunted transmon 500 comprises a superinductor material 520 as an inductive shunt. Superinductor 520 may comprise, for example, granular aluminum, Nb nanowire, and/or any other material with a high kinetic inductance. Materials with a high kinetic inductance have a high inductance as a result of their material properties, in contrast with geometrical inductors such as coils, which have an inductance as a result of their geometrical shape.

In the example of FIG. 5B, inductively shunted transmon 550 comprises a series array of M Josephson junctions 570 as an inductive shunt. While the M Josephson junctions are non-linear components, together they may approximate a linear inductance while also providing a periodic potential that would not otherwise be present with a typical linear inductor.

In the example of FIG. 5B, each of the M Josephson junctions in array 570 has a Josephson energy $E_J'$. The Josephson energy $E_J'$ may be the same as, or may differ from, the Josephson energy $E_J$ of the Josephson junction 560. According to some embodiments, the inductance provided by the series array 570 may be equal to (or may be proportional to)

$$\frac{E_{J'}}{M}.$$

In view of the desirable characteristic that $E_L \sim E_J$ and since M>1, therefore, in some embodiments the Josephson energy $E_J'$ may be greater than $E_J$.

In some embodiments, the ratio of the Josephson energy $E_J'$ to the Josephson energy $E_J$ is greater than or equal to 2, 3, 5, 8, 10, 15, or 20. In some embodiments, the ratio of the Josephson energy $E_J'$ to the Josephson energy $E_J$ is less than or equal to 25, 20, 15, 10, 8, 5, or 3. Any suitable combinations of the above-referenced ranges are also possible (e.g., a ratio $E_J'/E_J$ of greater than or equal to 3 and less than or equal to 10).

In some embodiments, the number M of Josephson junctions in series array 570 is greater than or equal to 2, 3, 4, 5, 8, 10, or 15. In some embodiments, the number M of Josephson junctions in series array 570 is less than or equal to 25, 20, 15, 10, 8, 5, or 3. Any suitable combinations of the above-referenced ranges are also possible (e.g., a number M of Josephson junctions in the series array of greater than or equal to 2 and less than or equal to 5).

Figure 6:
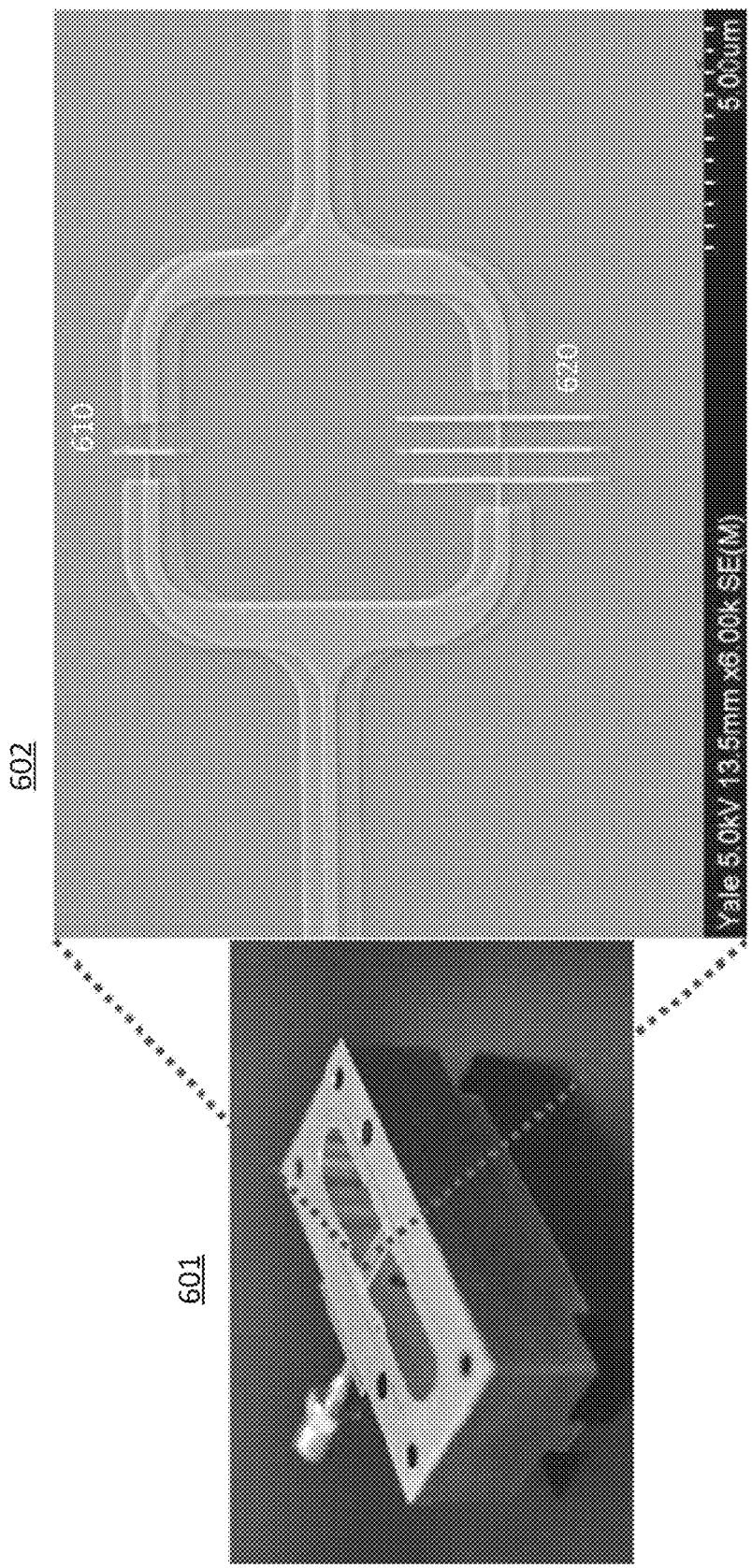
FIG. 6 depicts a physical realization of an inductively shunted transmon, according to some embodiments.

FIG. 6 depicts a physical realization of an inductively shunted transmon, according to some embodiments. In the example of FIG. 6, a device shown in photograph 601 comprises an inductively shunted transmon as shown in 602. The inductively shunted transmon includes a conventional transmon 610 shunted by a series array of three Josephson junctions 620 (e.g., equivalent to the inductively shunted transmon 550 with M=3).

Figure 7:
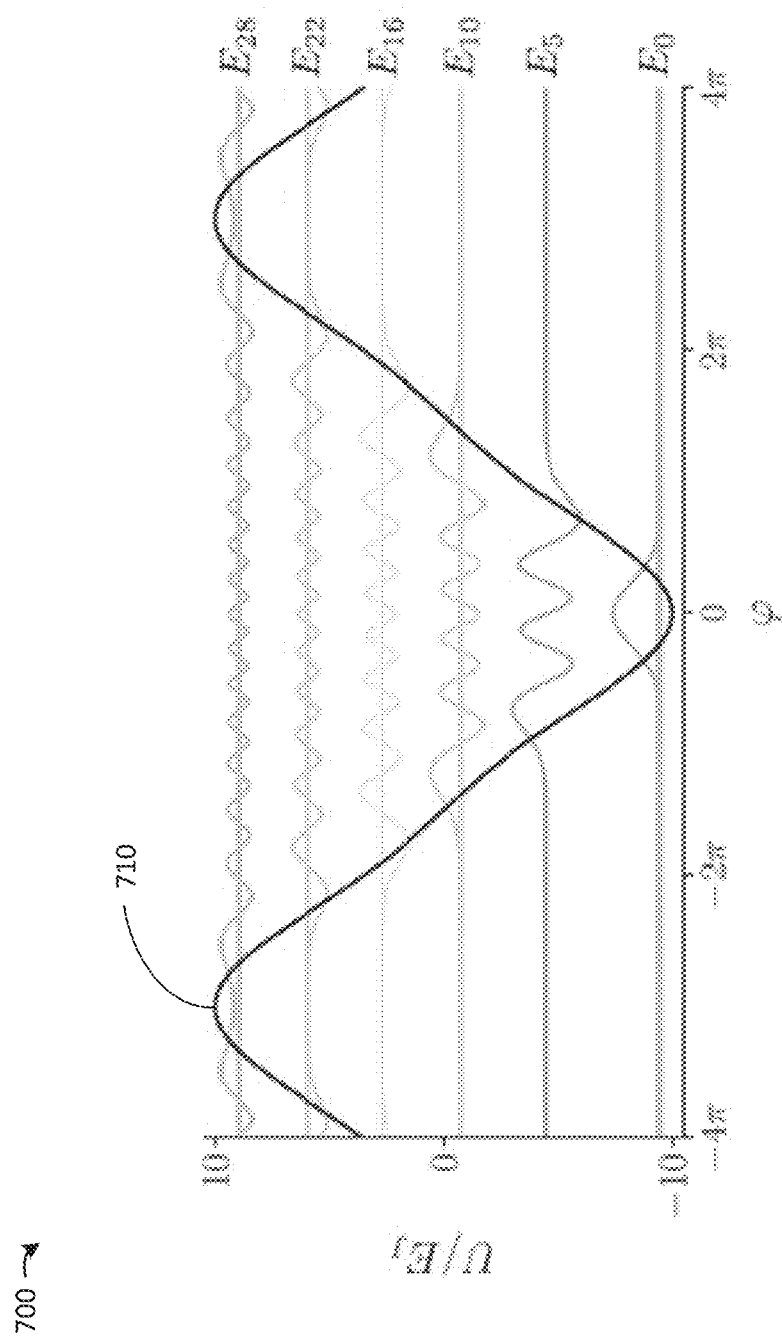
FIG. 7 illustrates the potential of the inductively shunted transmon of FIG. 6, according to some embodiments.

FIG. 7 illustrates the potential of the inductively shunted transmon of FIG. 6, according to some embodiments. In contrast to FIG. 4, which illustrates the potential of an inductively shunted transmon with an idealized inductance, FIG. 7 depicts the potential for the particular device of FIG. 5B in which M=3. Line 710 in diagram 700 depicts the inductively shunted transmon potential U normalized by the Josephson energy of the Josephson junction $E_J$, against the phase difference across the inductively shunted transmon φ. Also shown in diagram 700 are the wavefunctions of several energy eigenstates of the inductively shunted transmon qubit, including the ground state $E_0$, the fifth first excited state $E_5$, etc. It may be noted that the potential in FIG. 7 is still confined, although not to the same extent as in FIG. 4. Nonetheless, the implementation illustrated by FIG. 7 still represents a significant improvement over the implementation represented by FIG. 2. For instance, in FIG. 7 the potential is confining up to ten times the Josephson junction $E_J$ and up to the excited state $E_{28}$ (compared to the Josephson junction $E_J$ and the excited state $E_7$, respectively, in the case of FIG. 2). Note also that much greater localization of the wavefunctions within the potential well is achieved in the case of FIG. 7 compared with FIG. 2.

Having now described the structure of the inductively shunted transmon, some features of the device will now be described. As discussed below, the inductively shunted transmon has particularly useful characteristics that enable beneficial operations of a cQED system not otherwise available with a conventional transmon.

Figure 8:
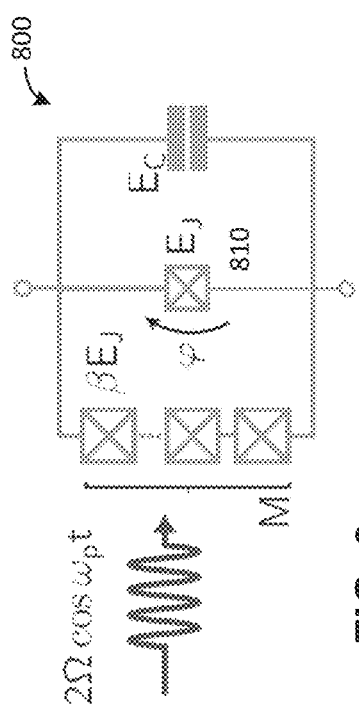
FIG. 8 depicts an experimental configuration in which a pump is applied to an inductively shunted transmon, according to some embodiments.

FIG. 8 depicts an experimental configuration upon which the subsequent description relies. In FIG. 8, an inductively shunted transmon 800 is pumped via a transmission line, with the pump being described by $2\Omega \cos \omega_p t$, where $\Omega$ is the amplitude of the pump, $\omega_p$ is the frequency of the pump, and t is time. Note that in the example of FIG. 8, the inductive shunt of the transmon 800 is represented by a series array of M Josephson junctions, which each have a Josephson energy $\beta E_J$, where $E_J$ is the Josephson energy of the primary Josephson junction of the transmon 810.

According to some embodiments, in the illustrative experimental setup, the frequency $\omega_p$ may be close to twice that of the qubit frequency $\omega_q$. As one non-limiting example, $\omega_q/2\pi$=4860 MHz and $\omega_p/2\pi$=9230 MHz. In some embodiments, the ratio $\omega_p/\omega_q$ may be equal to or greater than 1.0, 1.2, 1.4, 1.6, 1.8, or 2.0. In some embodiments, the ratio $\omega_p/\omega_q$ may be less than or equal to 2.2, 1.8, 1.6, 1.4, 1.2, or 1.0. Any suitable combinations of the above-referenced ranges are also possible (e.g., a ratio $\omega_p/\omega_q$ of between 1.4 and 1.8).

For the experimental configuration of FIG. 8, the Hamiltonian of the system may be written as:

$$\hat{H}(t) \approx \hat{H}_{qubit} + \hat{H}_{pump} \quad (1)$$
$$\approx 4E_C \hat{N}^2 - E_J \cos\hat{\varphi} + \frac{1}{2}E_L\hat{\varphi}^2 + 2\hbar\Omega\hat{N}\cos\omega_p t$$

where $\hat{N}$ is the transmon mode operator corresponding to the number of Cooper pairs across the junction, and $\hat{\varphi}$ represents the dimensionless flux operator across the Josephson junction 810.

Based on the Floquet theorem, solutions to the time-dependent Schrodinger equation are given by:

$$\Psi_n(t) = e^{-\in_n t/\hbar}\Phi_n(t)$$

where $$\Phi_n\left(t + \frac{2\pi}{\omega_p}\right) = \Phi_n(t)$$

$$-\frac{\hbar\omega_p}{2} \le \in_n \le \frac{\hbar\omega_p}{2} \quad (\mathrm{mod}\,\hbar\omega_p)$$

Hereafter, $\Psi_n(t)$ are referred to as Floquet states, $\Phi_n(t)$ as Floquet modes, and $\in_n$ as quasi-energies, with each of these quantities having the same mode index n. As noted above, the quasi-energies are invariant under translation by multiples of $\hbar\omega_p$.

Figure 9:
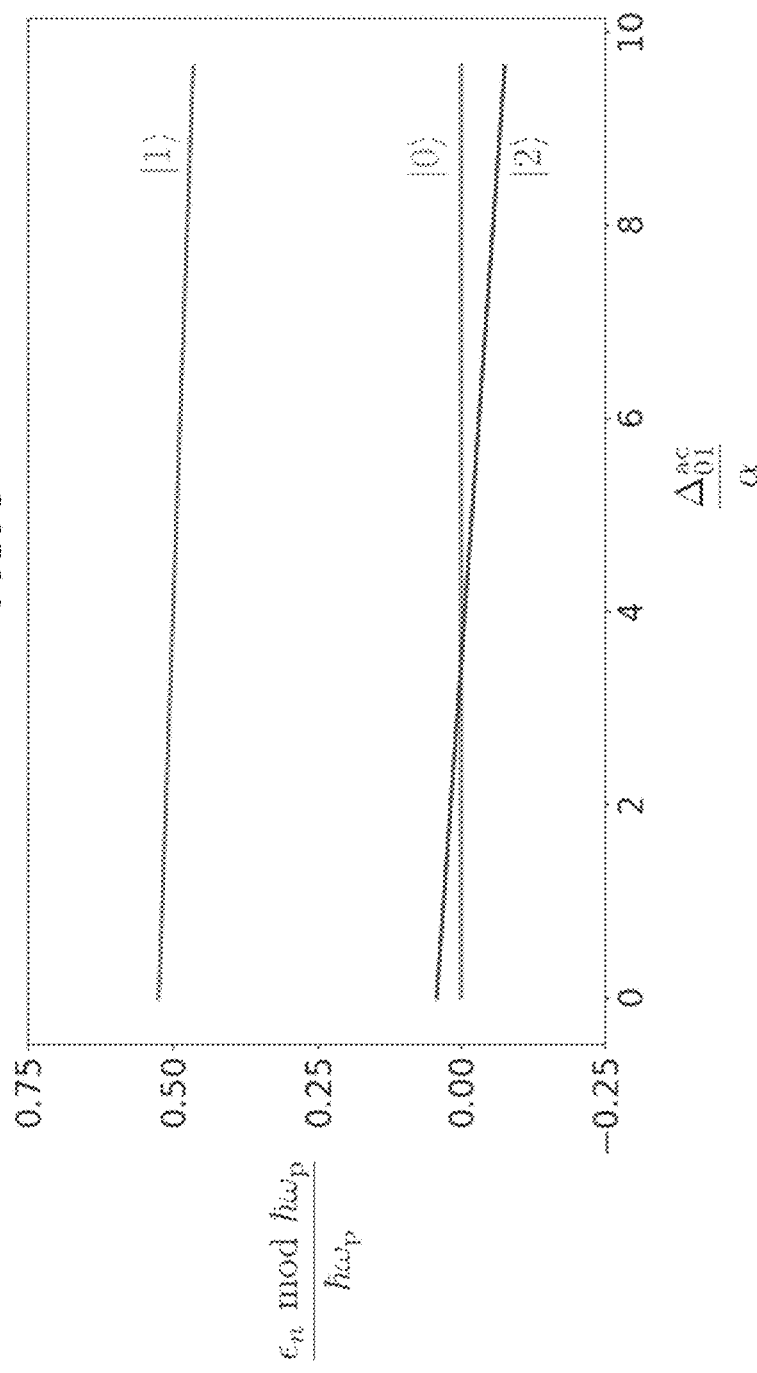
FIG. 9 depicts quasi-energies of several Floquet states of an inductively shunted transmon, according to some embodiments.

The quasi-energies of the Floquet states can be plotted, as shown in FIG. 9, which illustrates the quasi-energies for the states with index 0, 1 and 2 (where $\Psi_n$ is also referred to hereafter as $|n\rangle$; e.g., $\Psi_0$ as $|0\rangle$, $\Psi_1$ as $|1\rangle$, etc.). In FIG. 9, the quasi-energy is normalized by the pump frequency $\hbar\omega_p$ so that the illustrated quasi-energies span a vertical width of 1. Since the quasi-energies are invariant under translations of multiple of $\hbar\omega_p$ as noted above, the quasi-energies $\in_n$ are plotted mod $\hbar\omega_p$ so all values occupy the same illustrated range of values.

In the example of FIG. 9, the horizontal axis is expressed as $\Delta_{01}^{ac}$, the AC Stark shift between the $|0\rangle$ and $|1\rangle$ states, normalized by the anharmonicity α. The anharmonicity of the inductively shunted transmon is the difference between the energy gap between the first two energy levels and the energy gap between the second two energy levels: $\alpha = E_{12} - E_{01} = (E_2 - E_1) - (E_1 - E_0)$. The representation in FIG. 9 based on $$\frac{\Delta_{01}^{ac}}{\alpha}$$

expresses the pump strength in terms of the equivalent excitation that an operation performed in a time 1/α would generate. As an alternative, the value $$\frac{\Delta_{01}^{ac}}{\alpha}$$

may also be expressed as $$\left(\frac{\Omega}{\omega_p}\right)^2.$$

Figure 10:
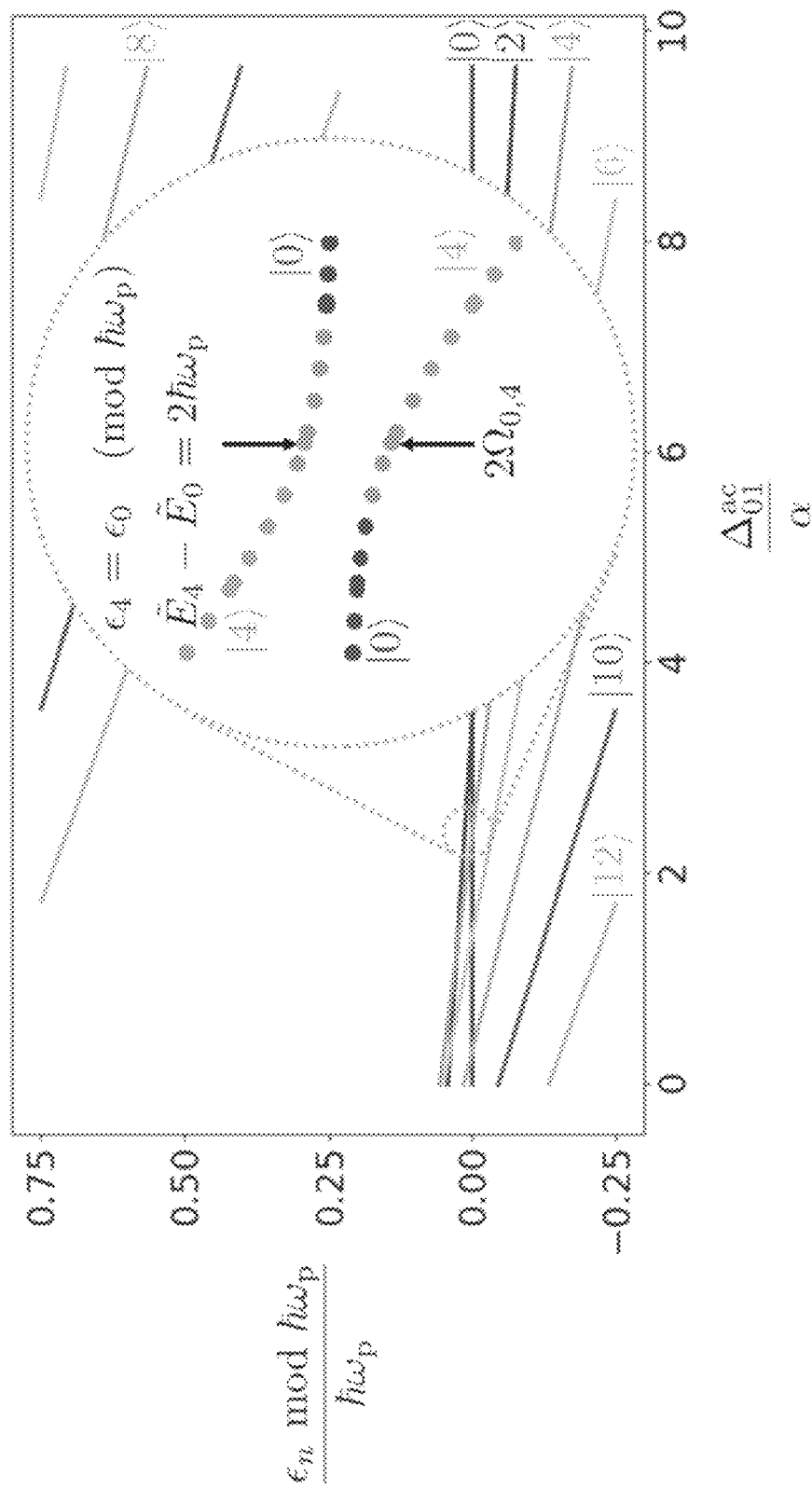
FIG. 10 depicts quasi-energies of Floquet states of an inductively shunted transmon, focusing on a crossing between 0th and 4th states, according to some embodiments.

Additional Floquet states may be plotted in the same manner, as shown in FIG. 10. As illustrated by FIG. 10, some of the quasi-energies cross one another for particular values of $$\frac{\Delta_{01}^{ac}}{\alpha}.$$

In particular, the $|0\rangle$ and $|4\rangle$ states cross in FIG. 10, details of which are shown in the circular inset. At this crossing, the pump may cause a transition between these Floquet states from the energy of two pump photons with an amplitude $\tilde{\Omega}_{0,4}$. This crossing and others like it represent instabilities in the dynamical state of the system and it is therefore desirable to avoid producing these instabilities. One challenge with avoiding the instability, however, is that the space of these states is very dense, as may be appreciated by FIG. 10, which only shows a select few states.

Nonetheless, the pump frequency may be tuned to reduce (and in some cases eliminate) the strength of particular Floquet state couplings. In some cases, one or more particular couplings may be targeted for this purpose since not all of these instabilities have the same coupling strength; indeed, certain crossings may produce greater instabilities than other crossings. For instance, FIG. 11 depicts an example of tuning the pump frequency $\omega_p$ such that the coupling strength of a particular crossing is sufficiently low, irrespective of the value of $$\frac{\Delta_{01}^{ac}}{\alpha}.$$

Figure 11:
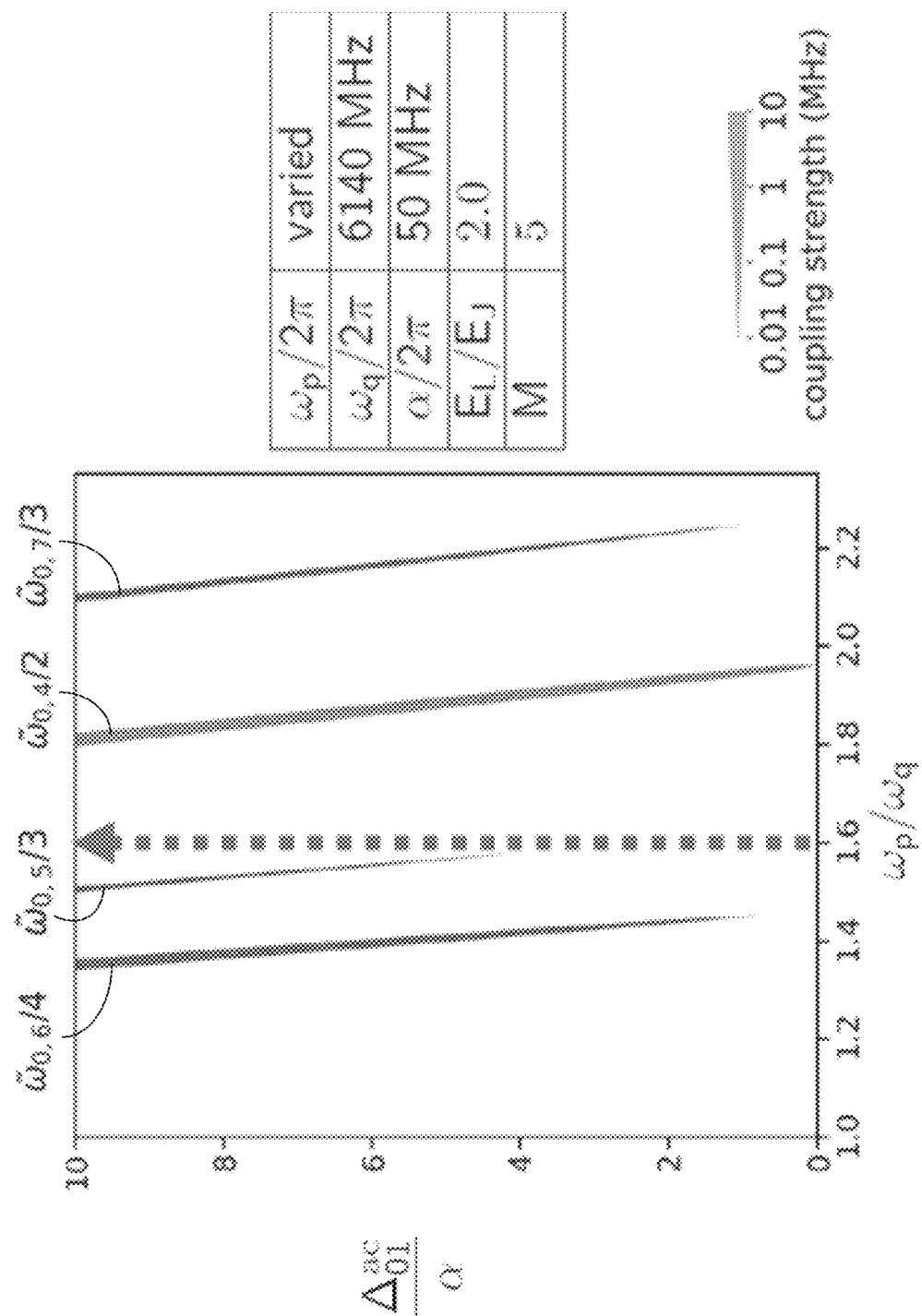
FIG. 11 depicts the coupling of four different crossings between Floquet states as a function of pump frequency and the normalized AC Stark shift, according to some embodiments.

FIG. 11 plots the coupling strength (represented by the thickness of the corresponding lines) of four different crossings as a function of pump frequency $\omega_p$ (normalized by the qubit frequency $\omega_q$) and the normalized AC Stark shift $$\frac{\Delta_{01}^{ac}}{\alpha}.$$

The crossings are written as $\tilde{\omega}_{a,b}/n$, for a crossing between Floquet states a and b, which is produced by n pump photons. As noted above, the crossing between the $|0\rangle$ and $|4\rangle$ states is the result of two pump photons, and so is written as $\tilde{\omega}_{0,4}/2$.

In the example of FIG. 11, the pump frequency may be tuned so that the coupling strength of each of the depicted four crossings is below 0.1 MHz, below 0.01 MHz, or below 0.001 MHz. As shown by the vertical dashed arrow, none of the crossings intersect for a pump frequency of 1.6 times the qubit frequency, irrespective of the value of $$\frac{\Delta_{01}^{ac}}{\alpha}.$$

As such, at least the depicted instabilities may be mitigated or avoided.

According to some embodiments, a pump of frequency $\omega_p$ may be applied to an inductively shunted transmon (e.g., via a transmission line), wherein $\omega_p$ may be selected so as to reduce or eliminate a coupling strength between a Floquet mode of the inductively shunted transmon qubit $|\Phi_n\rangle$ and a Floquet mode of the inductively shunted transmon qubit $|\Phi_m\rangle$ below a threshold value. In some embodiments, n=0 and m=4; or n=0 and m=5; or n=0 and m=6; or n=0 and m=7; or n=0 and m=8; or n=1 and m=5. In some embodiments, the threshold value is greater than or equal to 0.001 MHz, 0.01 MHz, 0.1 MHz, 1 MHz, or 10 MHz. In some embodiments, the threshold value is less than or equal to 10 MHz, 5 MHz, 1 MHz, 0.1 MHz, 0.05 MHz, 0.01 MHz, or 0.005 MHz. Any suitable combinations of the above-referenced ranges are also possible (e.g., a threshold value of greater than or equal to 0.005 MHz and less than or equal to 0.01 MHz, a threshold value equal to 0.01 MHz, a threshold value equal to 0.005 MHz, etc.). In some cases, the frequency $\omega_p$ may be selected to produce the above result; in other cases, a pump of frequency $\omega_p$ may be applied and the value of $\omega_p$ adjusted until the above result is produced.

It may be noted that the above-discussed and depicted structure of the crossings between Floquet states is particular to the inductively shunted transmon. For a conventional transmon, for instance, it may not be feasible to choose a pump frequency so as to reduce the coupling strength of these crossings in the manner shown in FIG. 11 due to greater degeneracy between the crossings. As such, the ability to tune the pump frequency so as to reduce or eliminate the coupling strength between the most problematic Floquet state couplings may be provided by the inductively shunted transmon, representing an additional advantage of the inductively shunted transmon beyond those discussed above.

In addition, the inductively shunted transmon provides a means to tune its behavior that a conventional transmon does not have. In particular, in a conventional transmon the values of $E_J$ and $E_C$ represent the only available ways to tune the behavior of the qubit. In an inductively shunted transmon, however, the inductive energy $E_L$ can also be tuned.

Considering an analysis of the inductively shunted transmon, for instance, by perturbatively expanding $\cos \hat{\varphi}$ in Equation (1) above in the absence of the pump:

$$\frac{H}{\hbar} \approx \omega_a a^\dagger a - \frac{\alpha}{12}(a+a^\dagger)^4 + \frac{\beta(r)}{120}(a+a^\dagger)^6$$

Where $a^\dagger$ and a are creation and annihilation operators, respectively, and:

$$\hbar\omega_a = \sqrt{8E_C E_J(1+r)}$$

$$\hbar\alpha = E_C/(1+r)$$

$$r = E_L/E_J$$

As a result of the above, the ratio $E_L/E_J$ can provide a useful way to tune the system, whereas a conventional transmon lacks this tuning 'knob'. That is, in a conventional transmon, $E_L=0$ so r=0 and so the ability to tune the parameter r simply does not exist.

Considering the pump applied to the inductively shunted transmon as before yields:

$$\frac{H}{\hbar} \approx \omega_a a^\dagger a - \frac{\alpha}{12}(a+a^\dagger)^4 + \frac{\beta(r)}{120}(a+a^\dagger)^6 - 2i\Omega\cos\omega_p t(a-a^\dagger)$$

This result may be used to determine the coupling strength of certain crossings between Floquet states as function of the tunable parameters of the inductively shunted transmon. For instance, considering the crossing between $|0\rangle$ and $|4\rangle$ Floquet states as shown in FIG. 10 and discussed above, the following may be derived:

$$\frac{H}{\hbar} \approx \delta a^\dagger a - \frac{\alpha}{2}a^{\dagger 2}a^2 + \frac{\beta(r)}{6}a^{\dagger 3}a^3 + \Omega_{0,4}(r)a^{\dagger 4} + h.c.$$

where $\omega_p = 2(\omega_a - \delta)$, and $\Omega_{0,4}$ is the amplitude of the coupling strength between the $|0\rangle$ and $|4\rangle$ Floquet states. The following relationship may further be determined:

$$\frac{\Omega_{0,4}}{\alpha} \propto \frac{\Delta_{ac}}{\alpha} \cdot \frac{\alpha}{\omega_a}(4.5 - r)$$

Figure 12:
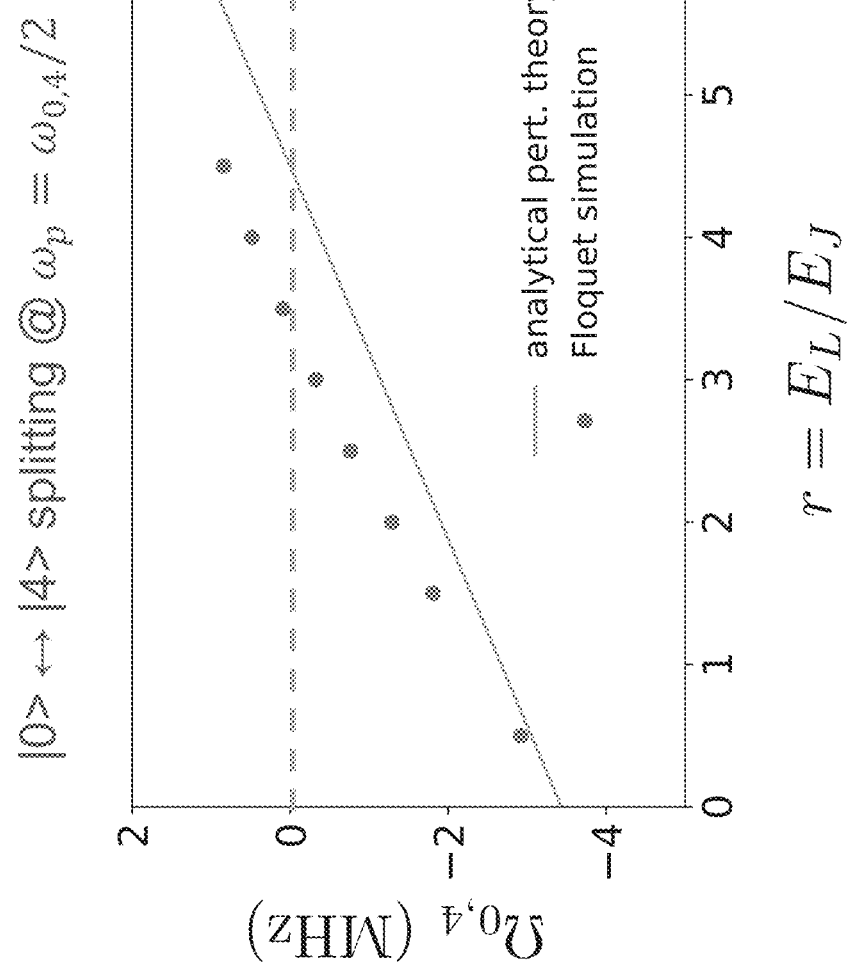
FIG. 12 illustrates a relationship between the ratio between the inductive energy and Josephson energy of the inductively shunted transmon and the amplitude of a coupling between 0th and 4th Floquet states, according to some embodiments.

This relationship is plotted in FIG. 12, showing the value of r against $\Omega_{0,4}$ (solid line). As may be noted, for a particular value of r, the amplitude of the coupling strength between the $|0\rangle$ and $|4\rangle$ Floquet states is reduced to zero. As a result, through appropriate selection of the ratio between the inductive energy and Josephson energy of the inductively shunted transmon, the undesirable instability produced by the coupling between $|0\rangle$ and $|4\rangle$ Floquet states may be mitigated or removed.

It will be appreciated that the above is an illustrative analysis and that in practice the value of r that reduces $\Omega_{0,4}$ to zero may not be exactly 4.5. However, the general technique of selecting r based on an undesirable coupling may nonetheless be applicable. As such, when fabricating an inductively shunted transmon the relative values of $E_L$ and $E_J$ may be selected to produce a desired effect on the amplitude of the coupling strength of one or more pairs of Floquet states.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A circuit quantum electrodynamics system comprising:
   a charge qubit, the charge qubit comprising an island of superconducting material coupled to a superconducting reservoir via a Josephson junction and coupled to at least one capacitor; and
   a series array of Josephson junctions coupled to the charge qubit such that the series array is coupled in parallel to the Josephson junction of the charge qubit and in parallel to the at least one capacitor of the charge qubit.

2. The circuit quantum electrodynamics system of claim 1, wherein each Josephson junction in the series array of Josephson junctions has a Josephson coupling energy $K_J'$, wherein the Josephson junction of the charge qubit has a Josephson coupling energy $K_J$, and wherein $K_J'$ is greater than $K_J$.

3. The circuit quantum electrodynamics system of claim 1, wherein the series array of Josephson junctions has a combined inductive energy $E_L$ that is between $0.8 \times E_J$ and $1.2 \times E_J$, where $E_J$ is the Josephson energy of the Josephson junction of the charge qubit.

4. The circuit quantum electrodynamics system of claim 3, wherein $E_L$ is between $0.9 \times E_J$ and $1.1 \times E_J$.

5. The circuit quantum electrodynamics system of claim 1, wherein the Josephson junction of the charge qubit has a Josephson coupling energy $K_J$, wherein the at least one capacitor of the charge qubit has a charging energy $E_C$, and wherein the ratio $E_J/E_C$ is at least 5.

6. The circuit quantum electrodynamics system of claim 5, wherein the ratio $E_J/E_C$ is at least 25.

7. The circuit quantum electrodynamics system of claim 1, wherein a dc magnetic flux threaded through an inductive loop formed by the series array of Josephson junctions and the charge qubit is less than $10^{-15}$ weber.

8. The circuit quantum electrodynamics system of claim 1, further comprising an oscillator coupled to the charge qubit and the series array of Josephson junctions.

9. The circuit quantum electrodynamics system of claim 8, wherein the oscillator is a microwave cavity.

10. The circuit quantum electrodynamics system of claim 1, further comprising a transmission line coupled to the charge qubit and the series array of Josephson junctions.

11. The circuit quantum electrodynamics system of claim 1, wherein the series array of Josephson junctions is M Josephson junctions coupled in series, and wherein M is greater or equal to 3 and M is less than or equal to 20.

12. The circuit quantum electrodynamics system of claim 11, wherein M is greater or equal to 5 and M is less than or equal to 10.

13. A circuit quantum electrodynamics system comprising:
   a charge qubit, the charge qubit comprising an island of superconducting material coupled to a superconducting reservoir via a Josephson junction and coupled to at least one capacitor; and
   a superinductor coupled in parallel to the Josephson junction of the charge qubit and in parallel to the at least one capacitor of the charge qubit.

14. The circuit quantum electrodynamics system of claim 13, wherein the superinductor has an inductive energy $E_L$ that is between $0.8 \times E_J$ and $1.2 \times E_J$, where $E_J$ is the Josephson energy of the Josephson junction of the charge qubit.

15. The circuit quantum electrodynamics system of claim 13, wherein the Josephson junction of the charge qubit has a Josephson coupling energy $K_J$, wherein the at least one capacitor of the charge qubit has a charging energy $E_C$, and wherein the ratio $E_J/E_C$ is at least 5.

16. The circuit quantum electrodynamics system of claim 13, wherein a dc magnetic flux threaded through an inductive loop formed by the superinductor and the charge qubit is less than $10^{-15}$ weber.

17. The circuit quantum electrodynamics system of claim 13, wherein the superinductor comprises granular aluminum.

18. A method of operating a circuit quantum electrodynamics (cQED) system, the cQED system comprising an inductively shunted transmon qubit coupled to a transmission line, the method comprising:
   applying a pump of frequency $\omega_p$ to the inductively shunted transmon qubit via the transmission line; and
   adjusting $\omega_p$, thereby causing a coupling strength between a Floquet mode of the inductively shunted transmon qubit $|\Phi_n\rangle$ and a Floquet mode of the inductively shunted transmon qubit $|\Phi_m\rangle$ to fall below a selected threshold,
   wherein n is 0 or 1, and wherein m is between 1 and 20.

19. The method of claim 18, wherein $\omega_p$ is selected so that the coupling strength remains below the selected threshold irrespective of the amplitude of the pump.

20. The method of claim 18, wherein the threshold is 0.1 MHz.

21. The method of claim 20, wherein the threshold is 0.01 MHz.

22. The method of claim 18, wherein the inductively shunted transmon qubit has a characteristic frequency $\omega_q$, and wherein $\omega_p$ is between $0.5\omega_q$ and $3.0\omega_q$.

23. The method of claim 22, wherein the inductively shunted transmon qubit has a characteristic frequency $\omega_q$, and wherein $\omega_p$ is between $1.4\omega_q$ and $1.8\omega_q$.

24. The method of claim 18, wherein n is 0 and m is 4.

25. The method of claim 18, wherein n is 1 and m is 5.

26. A circuit quantum electrodynamics system comprising:
   a charge qubit, the charge qubit comprising a Josephson junction coupled to at least one capacitor; and
   an inductor coupled in parallel to the Josephson junction of the charge qubit and in parallel to the at least one capacitor of the charge qubit,
   wherein the inductor has an inductive energy $E_L$, the Josephson junction has a Josephson energy $E_J$, and wherein $E_L/E_J$ is at least 3 and no greater than 6.

27. The circuit quantum electrodynamics system of claim 26, wherein the Josephson junction of the charge qubit has a Josephson coupling energy $K_J$, wherein the at least one capacitor of the charge qubit has a charging energy $E_C$, and wherein the ratio $E_J/E_C$ is at least 5.

28. The circuit quantum electrodynamics system of claim 26, wherein a dc magnetic flux threaded through an inductive loop formed by the series array of Josephson junctions and the charge qubit is less than $10^{-15}$ weber.

29. The circuit quantum electrodynamics system of claim 26, wherein $E_L/E_J$ is at least 4 and no greater than 5.

* * * * *

UNITED STATES PATENT AND TRADEMARK OFFICE
CERTIFICATE OF CORRECTION

Page 1 of 2

PATENT NO. : 11,223,355 B2
APPLICATION NO. : 16/711002
DATED : January 11, 2022
INVENTOR(S) : W. Clarke Smith et al.

It is certified that error appears in the above-identified patent and that said Letters Patent is hereby corrected as shown below:

In the Claims

Column 12, Claim 2, Line number 41:
"Josephson junctions has a Josephson coupling energy $K_J'$, wherein the Josephson junction of the charge qubit has a Josephson coupling energy $K_J$, and wherein $K_J'$ is greater than $K_J$."

Should read:
--Josephson junctions has a Josephson coupling energy $E_J'$, wherein the Josephson junction of the charge qubit has a Josephson coupling energy $E_J$, and wherein $E_J'$ is greater than $E_J$.--

Column 12, Claim 5, Line number 54:
"Josephson coupling energy $K_J$,"

Should read:
--Josephson coupling energy $E_J$,--

Column 13, Claim 15, Line number 26:
"a Josephson coupling energy $K_J$,"

Should read:
--a Josephson coupling energy $E_J$,--

Column 14, Claim 18, Line number 1:
"qubit $|\Phi_n)$ and a Floquet mode of the inductively shunted transmon qubit $|\Phi_m >$ to fall below a selected"

Should read:
--qubit $|\Phi_n\rangle$ and a Floquet mode of the inductively shunted transmon qubit $|\Phi_m\rangle$ to fall below a selected--

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*

Column 14, Claim 27, Line number 33:
"a Josephson coupling energy $K_J$,"

Should read:
--a Josephson coupling energy $E_J$,--